United States Patent [19]

Rath

[11] Patent Number: 4,758,785
[45] Date of Patent: Jul. 19, 1988

[54] PRESSURE CONTROL APPARATUS FOR USE IN AN INTEGRATED CIRCUIT TESTING STATION

[75] Inventor: Dale R. Rath, Gales Creek, Oreg.

[73] Assignee: Tektronix, Inc., Beaverton, Oreg.

[21] Appl. No.: 903,356

[22] Filed: Sep. 3, 1986

[51] Int. Cl.[4] .......................... G01R 1/06; G01R 31/02
[52] U.S. Cl. ............................ 324/158 P; 324/73 PC; 324/158 F
[58] Field of Search ........... 324/158 P, 158 F, 73 PC; 200/47; 364/559

[56] References Cited

U.S. PATENT DOCUMENTS

| | | | |
|---|---|---|---|
| 3,996,517 | 12/1976 | Fergason et al. | 324/158 F X |
| 4,066,943 | 1/1978 | Roch | 324/158 F X |
| 4,219,771 | 8/1980 | Reid et al. | 324/158 F X |
| 4,328,553 | 5/1982 | Fredriksen et al. | 364/559 X |
| 4,649,339 | 3/1987 | Grangroth et al. | 324/158 P X |

*Primary Examiner*—Reinhard J. Eisenzopf
*Assistant Examiner*—Vinh P. Nguyen
*Attorney, Agent, or Firm*—William S. Lovell; Jay K. Malkin

[57] ABSTRACT

An apparatus for controlling the pressure exerted on a probe in an integrated circuit testing station is disclosed. The apparatus is mounted to a support structure within the station directly above the probe. The testing station further includes a motorized lift system for moving an integrated circuit upward against the probe for testing. The invention uses a pressure pad positioned directly above the probe which is attached to the support structure using a resilient member. Associated with the pad is an electrical contact system connected to the lift system. As the lift system moves the circuit upward, it contacts the probe which pushes against the pad. Movement of the probe and circuit against the pad permits secure engagement of the probe with the circuit. As the circuit continues to move upward, the pad is urged upward, causing the electrical contact system to deactivate the lift system before damage to the probe occurs.

19 Claims, 2 Drawing Sheets

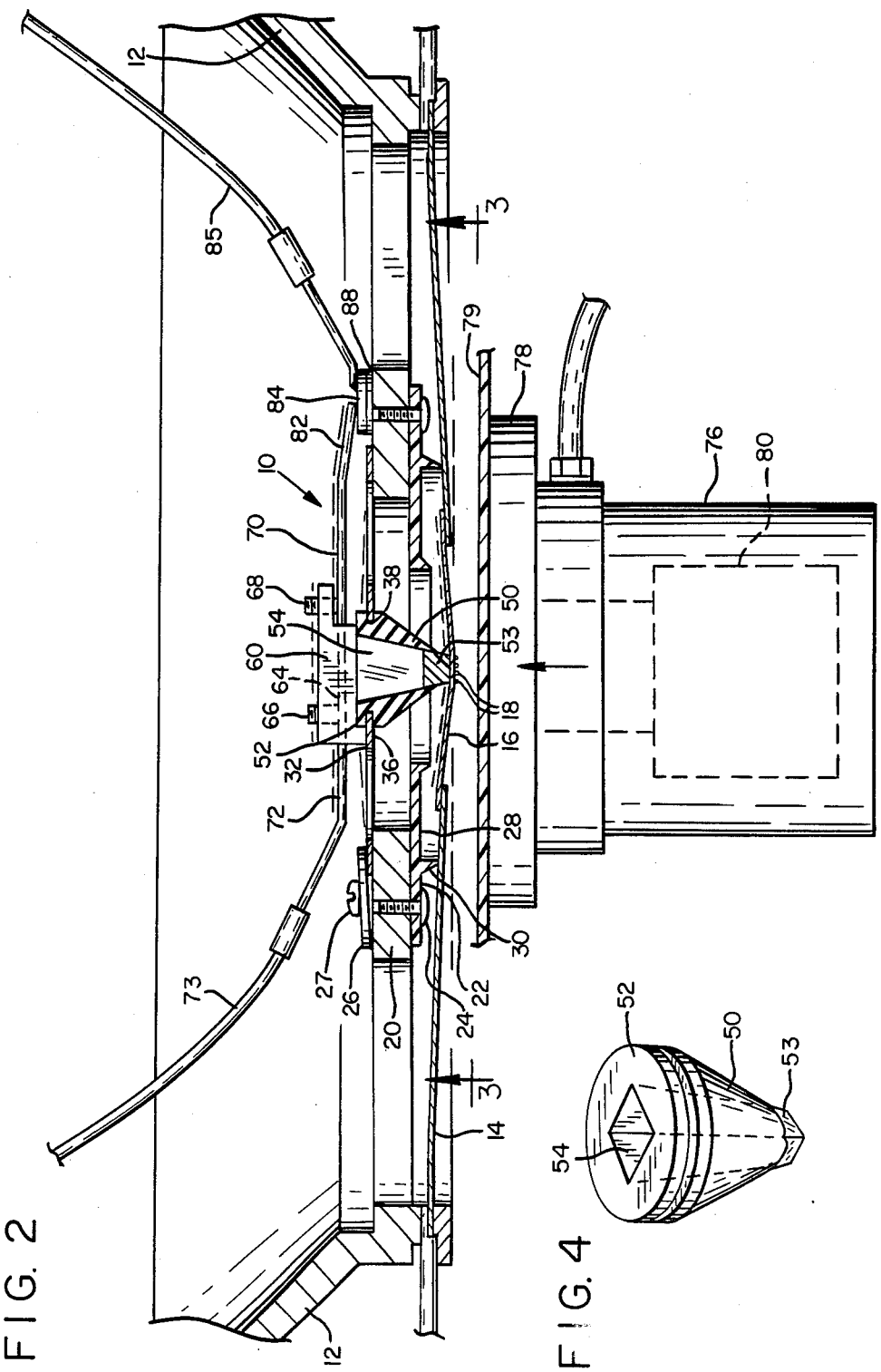

PRESSURE CONTROL APPARATUS FOR USE IN AN INTEGRATED CIRCUIT TESTING STATION

BACKGROUND OF THE INVENTION

The present invention generally relates to probe systems used in integrated circuit testing stations, and more particularly to a probe system incorporating a pressure control apparatus for maintaining the proper pressure on a test probe in an integrated circuit testing station.

An important step in the production of integrated circuits involves the testing of each circuit to determine whether it has been properly manufactured. It is generally desirable to evaluate the performance of integrated circuits as early as possible in the fabrication process. To accomplish this, electrical connections are made to all of the integrated circuit's external connection points. Test signals are then applied to the circuit, and its performance is evaluated.

To test integrated circuits in an efficient manner, an integrated circuit test probe system has been developed by Tektronix, Inc. of Beaverton, Oreg. which is the subject of co-pending patent applications. This system consists of a flexible probe in the form of a small square of transparent polyimide film approximately 0.001" thick. The underside of the film includes a plurality of metal pads deposited thereon. The metal pads are preferably manufactured from nickel, and are arranged in a pattern which matches the contact areas (bond pads) on the integrated circuit. The metal pads on the polyimide film probe are electrically connected by transmission lines routed to the edges of the film probe using, for example, microstrip line geometry techniques.

In a preferred form of the probe system, a ground plane is deposited on the top surface of the polyimide film. However, the ground plane does not cover the areas of the film in the vicinity of the metal pads. As a result, the metal pads can be viewed through the film, thereby permitting visual alignment of the pads with respect to the circuit being tested.

The polyimide film probe is mounted to and supported along its edges by a printed circuit board. Transmission lines on the printed circuit board provide a connection between the probe and coaxial connectors along the outside periphery of the printed circuit board.

To use the above-described testing system, the polyimide film probe and printed circuit board are mounted in a fixed position on a support structure. Beneath the probe and support structure, an apparatus is provided which includes means for elevating the circuit to be tested upward toward the probe. Preferably, a vacuum chuck device is used which includes a platform having a vacuum system for maintaining an integrated circuit chip or wafer thereon, and a stepper motor for progressively elevating the platform and circuit upward toward the probe. To test the integrated circuit, the circuit must be raised upward in an amount sufficient to contact the metal pads on the underside of the probe.

However, it is necessary to ensure that the test pads of the probe are sufficiently in contact with the integrated circuit being tested, and that such contact is maintained throughout the testing process. It is also necessary to control the upward movement of the platform and integrated circuit so that the circuit will not exert undue pressure on the probe when the metal pads of the probe contact the circuit. If the stepper motor in the vacuum chuck is not precisely controlled, excessive pressure will be generated by the upward movement of the integrated circuit against the polyimide film probe. Such pressure can cause significant damage to the probe. Typically, a pressure level of 3 grams exerted on each probe pad will be sufficient to enable proper testing of the circuit in a non-destructive manner. Pressure levels exceeding 10 grams per probe pad will most likely cause damage. However, this value may vary, depending on the type and thickness of the probe being used.

The present invention represents a probe station accessory for ensuring that the proper pressure is applied to the probe during the testing of an integrated circuit, and that sufficient contact is made between the probe and circuit. As a result, accurate test results are achieved, and the likelihood of damage to the probe by the application of excessive pressure thereto is minimized.

SUMMARY OF THE INVENTION

It is an object of the present invention to provide a pressure control apparatus in an integrated circuit testing station for ensuring that the proper pressure is applied to a test probe during the testing of an integrated circuit.

It is another object of the present invention to provide a pressure control apparatus in an integrated circuit testing station designed to ensure that sufficient and complete contact is made between the contact points of the test probe and circuit being tested.

It is a further object of the present invention to provide a pressure control apparatus in an integrated circuit testing station which is capable of limiting the amount of pressure exerted on a test probe during the testing of a circuit in order to preserve the structural and functional integrity of the probe.

It is a still further object of the present invention to provide a pressure control apparatus in an integrated circuit testing station which is characterized by a high degree of accuracy and pressure sensitivity.

It is a still further object of the present invention to provide a pressure control apparatus in an integrated circuit testing station which uses a minimal number of moving components, and is inexpensive to manufacture.

In accordance with the above-described objects, a pressure control apparatus is provided for use in an integrated circuit testing station which includes a pressure pad secured to a stationary support structure using a resilient retaining member. The pressure pad includes a resilient, elastomeric body portion having a rigid tip secured to the body portion, and a longitudinal bore downward through the body portion. The resilient retaining member used to attach the pressure pad to the support structure permits vertical movement of the pressure pad with respect to the support structure. Secured to the resilient retaining member is an elongate conductive member having first and second ends. The first end is electrically connected to a motor within a vacuum chuck having a platform for elevating the circuit to be tested in an upward direction. The second end of the conductive member is normally in contact with a conductor pad mounted to the support structure. The conductor pad is insulated from the support structure, and is also electrically connected to the motor in the vacuum chuck. When the second end of the conductive member contacts the conductor pad, a completed electrical circuit is created with respect to the motor in the chuck.

In operation, a printed circuit board having a polyimide film probe is first secured to the support structure to which the pressure pad is attached. The probe is secured to the support structure directly beneath the pressure pad. The pad is designed to abut the upper surface of the probe and urges the probe slightly downward. As a result, the probe extends outward from the plane of its associated circuit board. The motor in the vacuum chuck is then turned on, and the integrated circuit moves upward toward the probe. Once the integrated circuit reaches the probe, it pushes upward against the probe. The probe then moves upward, exerting pressure against the pressure pad. Initially, the pad resists the upward movement of the probe. Such resistance ensures that the contact points of the probe are maintained in contact with the integrated circuit. As the integrated circuit continues to move upward against the probe and pressure pad, the pressure pad begins to move upward by virtue of the resilient retaining member which secures the pressure pad to the support structure. As the pressure pad continues to move upward, the second end of the elongate conductive member moves away from the conductor pad on the support structure, thereby breaking the motor circuit and stopping the movement of the integrated circuit against the probe. Stoppage of the motor in this manner permits the proper pressure to be applied for testing the integrated circuit, and prevents damage to the probe from excessive pressures exerted by the moving integrated circuit.

These and other objects, features, and advantages of the invention will be further described in the following drawings and detailed description of a preferred embodiment.

BRIEF DESCRIPTION OF THE DRAWINGS

FIG. 2 is a partial cross sectional view taken along lines 2—2 of FIG. 1.

FIG. 4 is a perspective view of the pressure pad used in the present invention.

DETAILED DESCRIPTION

Figure 1:
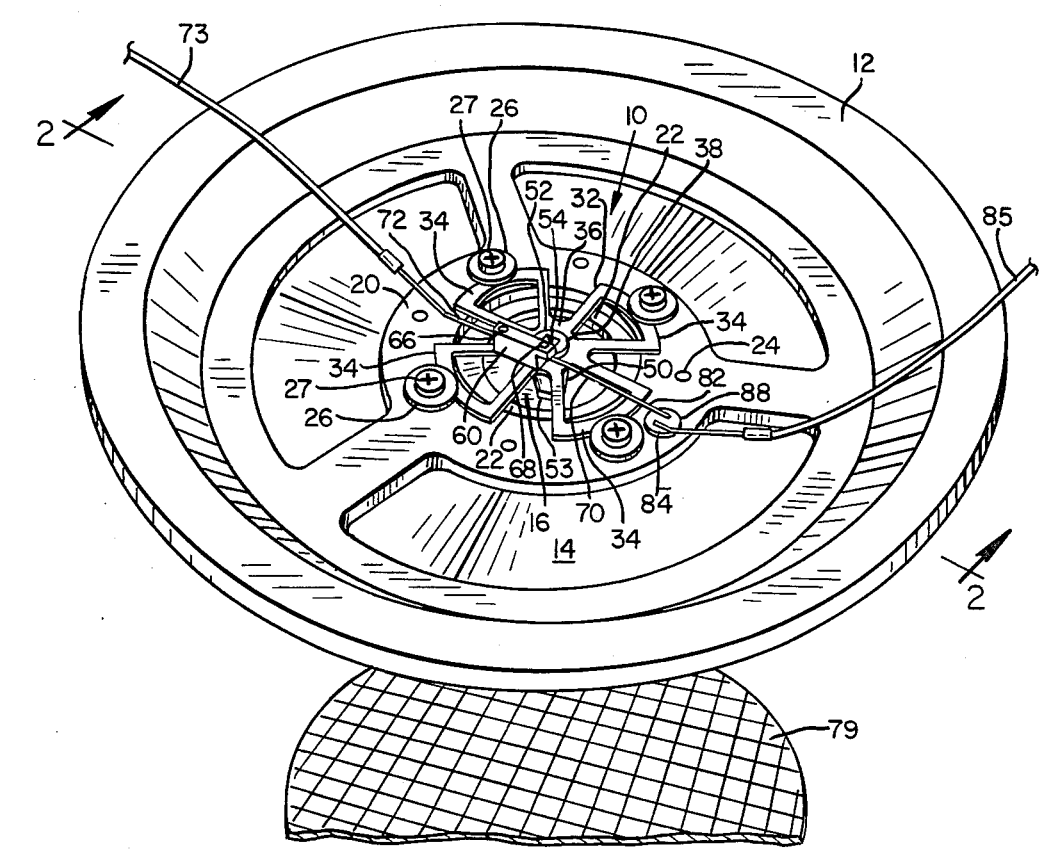
FIG. 1 is a perspective view of the pressure control apparatus of the present invention attached to a support structure having a printed circuit board and probe mounted thereunder.

The present invention 10 involves an apparatus designed to sense and control the pressure exerted on a polyimide film probe during the testing of an integrated circuit. With reference to FIG. 1, the invention 10 is shown secured to a support structure 12. The support structure 12 is secured to a suitable stationary support frame (not shown). As illustrated in FIG. 2, attached to the support structure 12 is a printed circuit board 14 to which a polyimide film probe 16 is secured. The polyimide film probe 16 includes a plurality of metal pads 18 designed to match the contact areas on the integrated circuit being tested. The metal pads 18 are preferably manufactured of nickel, and plated on the underside of the polyimide film probe 16. As indicated above, the probe 16 is covered by a ground plane except for the areas overlying the pads 18. Accordingly, the probe 16 is transparent in the vicinity of the pads 18.

Figure 3:
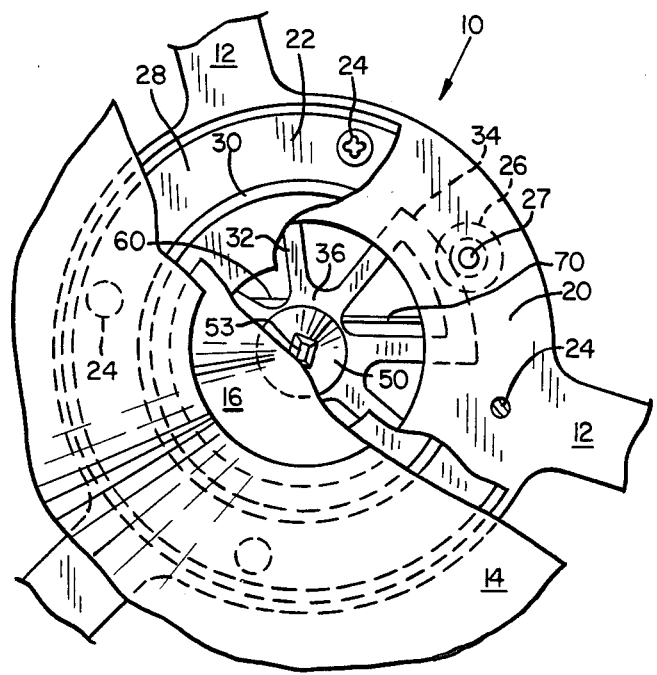
FIG. 3 is a partial bottom view taken along lines 3—3 of FIG. 2 having portions of the support structure, printed circuit board, and polyimide film probe broken away to illustrate the components of the present invention.

The invention 10 is mounted to a ring portion 20 on the support structure 12, as shown in FIGS. 1 and 3. The structural components of the invention 10 include an annular member 22 preferably manufactured of a smooth, strong plastic (e.g. Teflon(®)) secured to the ring portion 20 using screws 24 (FIG. 3). The underside 28 of the annular member 22 includes an annular flange 30 which abuts the circuit board 14 surrounding the polyimide film probe 16.

Positioned beneath washers 26 and secured in position using screws 27 as shown in FIG. 1 is a resilient retaining member 32 having four connecting portions 34 which extend radially outward from a center portion 36. The resilient retaining member 32 is preferably manufactured of a beryllium-copper metal alloy, and is approximately 0.010 inches thick. Such material is characterized by a high degree of resilience and flexibility, the usefulness of which will be explained below.

With reference to FIGS. 2 and 4, molded within an opening 38 in the center portion 36 of the resilient retaining member 32 is a resilient, pressure pad 50 preferably manufactured of clear silicone rubber. The pressure pad 50 includes an enlarged top portion 52 having a greater diameter than the opening 38 in the resilient retaining member 32. Accordingly, the top portion 52 maintains the pressure pad 50 in position relative to the retaining member 32 during use.

The pressure pad 50 also includes a non-resilient tip 53 made of a hard, clear plastic (e.g. clear acrylic plastic). Provided within the interior of the pressure pad 50 is a bore 54 extending downwardly through the center longitudinal axis of the pressure pad 50. The bore 54 enables a user of the probe station to look directly downward through the pressure pad 50, through the tip 53, and into the transparent region of the polyimide film probe 16. This enables proper alignment of the probe 16 with the circuit being tested.

As shown in FIGS. 1 and 2, a support block 60 is affixed to the resilient retaining member 32 using an epoxy resin adhesive known in the art. The support block 60 includes a bore 64 and two set screws 66, 68. Inserted within the bore 64 is an elongate conductive member 70, preferably in the form of a gold plated beryllium-copper wire. The conductive member 70 is maintained within the support block 60 using set screw 66.

The elongate conductive member 70 has a first end 72 which is electrically connected by a lead 73 to a device designed to retain an integrated circuit in a fixed position while elevating the circuit upward toward the polyimide film probe 16. As shown in FIG. 2, this device is positioned beneath the support structure 12, and includes vacuum chuck 76 having a platform 78 for holding an integrated circuit chip or wafer 79, and an internal stepper motor 80 for vertically moving the platform 78. The first end 72 of the elongate conductive member 70 is electrically connected to the stepper motor 80.

The second end 82 of the elongate conductive member 70 normally rests against a conductor pad 84 secured to and insulated from the support structure 12 at position 88 on the ring portion 20 (FIG. 1). Preferably, a gold-plated ceramic pad is used, the underside of which includes an insulating layer of polyimide film. The conductor pad 84 is preferably secured to the support structure 12 by soldering.

The conductor pad 84 is electrically connected by a lead 85 to the stepper motor 80 of the vacuum chuck 76, as shown in FIG. 2. In the absence of any upward pressure on the pressure pad 50, a completed electrical circuit exists through the elongate conductive member 70 and conductor pad 84 to the stepper motor 80 so that the motor 80 may be operated as discussed below.

OPERATION

In operation, both the pressure pad 50 and the pressure sensing components of the invention 10, including the elongate conductive member 70 and conductor pad 84, cooperate to ensure that the contact pads of the probe make sufficient, continuous, and non-destructive contact with the integrated circuit. As shown in FIG. 2, the tip 53 of the pressure pad 50 urges the flexible probe 16 and metal pads 18 in a downward direction, extending outward from the plane formed by the printed circuit board 14. The annular flange 30 of the annular member 22 which abuts the circuit board 14 surrounding the probe 16 also permits movement of the probe 16 outward from the plane of the circuit board 14. This outward orientation facilitates contact by the probe with the circuit.

To test an integrated circuit, the stepper motor 80 in the vacuum chuck 76 is activated, allowing the upward movement of the platform 78 and integrated circuit chip or wafer 79. Operation of the stepper motor 80 is permitted by virtue of the completed electrical pathway through the elongate conductive member 70 and conductor pad 84. Once the circuit 79 makes contact with the metal pad 18 on the polyimide film probe 16, the circuit 79 continues to move upward against the probe 16 and pressure pad 50. Initially, the pressure pad 50 prevents the probe 16 from moving upward when the circuit 79 contacts the probe 16. The prevention of such upward movement permits the metal pads 18 of the probe 16 to contact the circuit 79 in a secure and complete manner.

As the circuit 79 continues to move upward against the probe 16 and pressure pad 50, the pressure pad 50 begins to move upward by virtue of the resilient retaining member 32. As the pressure pad 50 continues to move, the second end 82 of the elongate conductive member 70 moves away from the conductor pad 84. As a result, the completed circuit through the elongate conductive member 70 allowing operation of the stepper motor 80 is broken, and the upward movement of the circuit 79 is stopped, thereby permitting the proper pressure to be applied to the polyimide film probe 16, and avoiding damage thereto. The dashed lines in FIG. 2 illustrate the position of the components in the invention 10 after the stepper motor circuit has been broken.

The pressure exerted by the second end 82 of the elongate conductive member 70 on the conductor pad 84 is controlled by the set screw 68. As a result, the allowable upward movement of the circuit 79 against the polyimide film probe 16 can be controlled by the set screw 68. If the set screw 68 is turned in a manner whereby the second end 82 of the elongate conductive member 70 is pushed downward against the conductor pad 84, the circuit 79 will exert a greater pressure against the polyimide film probe 16 before the electrical circuit to the stepper motor 80 is broken. Again, the desired amount of pressure to be exerted by the integrated circuit is selectively variable, depending on the type of probe being used.

Having described a preferred embodiment of the present invention, various parameters thereof may be modified by one skilled in the art within the scope of the invention. Accordingly, the scope of the invention is to be construed only according to the following claims.

I claim:

1. A pressure control apparatus for use in an integrated circuit testing station having a probe, and lift means beneath said probe for elevating an integrated circuit upward toward and against said probe, said pressure control apparatus comprising:
   a support structure;
   a pressure pad moveably attached to said support structure directly above said probe, and said pressure pad further permitting visual observation of said integrated circuit down through said pressure pad;
   means for resiliently attaching said pressure pad to said support structure in a manner permitting a vertical movement of said pressure pad relative to said support structure; and
   sensor means associated with said pressure pad for stopping an upward movement of said integrated circuit against said probe when a desired pressure level exerted by said integrated circuit against said probe has been reached.

2. The pressure control apparatus of claim 1 wherein said support structure comprises a ring-shaped member having an open center portion therein.

3. The pressure control apparatus of claim 2 wherein said means for resiliently attaching said pressure pad to said support structure comprises a resilient retaining member attached to said ring-shaped member with said pressure pad being secured to said resilient member at a position thereon wherein said pressure pad is positioned within said open center portion of said ring-shaped member.

4. The pressure control apparatus of claim 3 wherein said resilient retaining member comprises a plurality of outwardly extending connecting portions and a center portion, said connecting portions being secured to said ring-shaped member of said support structure with said pressure pad being secured to said center portion of said resilient retaining member.

5. The pressure control apparatus of claim 3 wherein said resilient retaining member is comprised of a beryllium-copper alloy.

6. The pressure control apparatus of claim 1 wherein said pressure pad comprises a resilient body portion and a non-resilient tip portion secured to said body portion.

7. The pressure control apparatus of claim 6 wherein said pressure pad further comprises a longitudinal bore through said body portion, said bore permitting a user of said pressure control apparatus to look downwardly through said bore, through said tip, and into said probe.

8. A pressure control apparatus for use in an integrated circuit testing station having a probe, and lift means beneath said probe for elevating an integrate circuit upward toward and against said probe, said pressure control apparatus comprising:
   a support structure;
   a pressure pad movably attached to said support structure directly above said probe;
   means for resiliently attaching said pressure pad to said support structure in a manner permitting a vertical movement of said pressure pad relative to said support structure; and
   sensor means associated with said pressure pad for stopping an upward movement of said integrated circuit against said probe when a desired pressure level exerted by said integrated circuit against said probe has been reached comprising an elongate conductive member secured to said means for resiliently attaching said pressure pad to said support structure, said conductive member having first and second ends, said first end being electrically connected to said lift means, and a conductor pad secured to said support structure and insulated therefrom, said pad being electrically connected to said lift means, said second end of said elongate conductive member normally being in contact with said pad, and coming out of contact therewith when said integrated circuit reaches said probe and exerts said desired pressure thereon.

9. The pressure control apparatus of claim 8 wherein said elongate conductive member comprises a gold plated, beryllium-copper wire.

10. The pressure control apparatus of claim 8 wherein said sensor means further comprises tension adjustment means for controlling an amount of pressure necessary to bring said second end of said elongate conductive member out of contact with said conductor pad.

11. The pressure control apparatus of claim 10 wherein said tension adjustment means comprises a retaining block having means therein for engaging said second end of said elongate conductive member in a manner wherein said second end is urged downward toward said conductor pad on said support structure.

12. The pressure control apparatus of claim 8 wherein said conductor pad comprises a ceramic member having a layer of gold thereon.

13. A pressure control apparatus for use in an integrated circuit testing station having a probe secured to a support structure, and lift means beneath said probe for elevating an integrated circuit upward toward and against said probe, said pressure control apparatus comprising:
a pressure pad movably attached to said support structure directly above said probe;
means for resiliently attaching said pressure pad to said support structure in a manner permitting a vertical movement of said pressure pad relative to said support structure, said means comprising a resilient retaining member having a center portion to which said pressure pad is secured; and
sensor means assoicated with said pressure pad for stopping an upward movement of said integrated circuit against said probe when a desired pressure level exerted by said integrated circuit against said probe has been reached, said sensor means comprising an elongate conductive member secured to said resilient retaining member, said elongate conductive member having first and second ends, said first end being electrically connected to said lift means, said sensor means further comprising a conductor pad secured to said support structure and insulated therefrom, said conductor pad being electrically connected to said lift means, said second end of said elongate conductive member normally being in contact with said conductor pad, and coming out of contact with said conductor pad when said integrated circuit reaches said probe and exerts said desired pressure thereon.

14. The pressure control apparatus of claim 13 wherein said sensor means further comprises tension adjustment means for controlling an amount of pressure necessary to bring said second end of said elongate conductive member out of contact with said conductor pad.

15. The pressure control apparatus of claim 14 wherein said tension adjustment means comprises a retaining block having means therein for engaging said second end of said elongate conductive member in a manner wherein said second end is urged downward toward said conductor pad on said support structure.

16. A pressure control apparatus for use in an integrated circuit testing station having a probe, and lift means beneath said probe for elevating an integrated circuit upward toward and against said probe, said pressure control apparatus comprising:
a support structure;
a pressure pad movably attached to said support structure directly above said probe;
means for resiliently attaching said pressure pad to said support structure in a manner permitting the vertical movement of said pressure pad relative to said support structure, said means comprising a resilient retaining member having a center portion to which said pressure pad is attached, said support structure comprising a ring-shaped member having an open center portion therein, said resilient retaining member being attached to said ring-shaped member at a position thereon wherein said pressure pad on said resilient retaining member is positioned within said open center portion of said ring-shaped member;
sensor means associated with said pressure pad for stopping an upward movement of said integrated circuit against said probe when a desired pressure level exerted by said integrated circuit against said probe has been reached, said sensor means comprising an elongate conductive memer secured to said resilient retaining member, said elongate conductive member having first and second ends, said first end being electrically connected to said lift means, said sensor means further comprising a conductor pad secured to said support structure and insulated therefrom, said conductor pad being electically connected to said lift means, said second end of said elongate conductive member being normally in contact with said conductor pad, and coming out of contact with said conductor pad when said integrated circuit reaches said probe and exerts said desired pressure thereon; and
tension adjustment means for controlling the amount of pressure necessary to bring said second end of said elongate conductive member out of contact with said conductor pad on said support structure, said tension adjustment means comprising a retaining block having means therein for engaging said second end of said elongate conductive member in a manner wherein said second end is urged downward toward said conductor pad on said support structure.

17. A pressure control apparatus for use in an integrated circuit testing station having a probe secured to a support structure, and lift means beneath said probe for elevating an integrated circuit upward toward and against said probe, said pressure control apparatus comprising: a pressure pad attached to said support structure directly above said probe, said pressure pad comprising a resilient body portion and a non-resilient tip portion secured to said body portion, said pressure pad permitting a complete and secure engagement of said probe with said integrated circuit after said lift means has elevated said integrated circuit up to and against probe, and said pressure pad further permitting visual inspection of said integrated circuit down through said pressure pad.

18. The pressure control apparatus of claim 17 wherein said body portion of said pressure pad comprises a longitudinal bore therethrough, said bore permitting a user of said pressure control apparatus to look downwardly through said bore, through said tip portion and into said probe.

19. The pressure control apparatus of claim 17 wherein said body portion of said pressure pad is comprised of transparent silicone rubber, and said tip portion is comprised of non-resilient, transparent plastic.

* * * * *